(12) United States Patent
Tanaka

(10) Patent No.: US 6,816,409 B2
(45) Date of Patent: Nov. 9, 2004

(54) NON-VOLATILE SEMICONDUCTOR MEMORY DEVICE AND REWRITING METHOD

(75) Inventor: Hidehiko Tanaka, Nara (JP)

(73) Assignee: Sharp Kabushiki Kaisha, Abeno-ku (JP)

(*) Notice: Subject to any disclaimer, the term of this patent is extended or adjusted under 35 U.S.C. 154(b) by 0 days.

(21) Appl. No.: 10/654,674

(22) Filed: Sep. 3, 2003

(65) Prior Publication Data

US 2004/0071023 A1 Apr. 15, 2004

(30) Foreign Application Priority Data

Sep. 6, 2002 (JP) .................................. 2002-261921

(51) Int. Cl.$^7$ .......................... G11C 16/04; G11C 16/06
(52) U.S. Cl. .............................. 365/185.03; 365/185.4; 365/185.2; 365/185.24
(58) Field of Search ...................... 365/185.03, 185.04, 365/185.2, 185.24

(56) References Cited

U.S. PATENT DOCUMENTS

| | | | |
|---|---|---|---|
| 5,738,193 A | 6/1998 | Hsing-Ya et al. | |
| 5,818,762 A | 10/1998 | Maari et al. | |
| 5,909,449 A | 6/1999 | So et al. | |
| 6,195,287 B1 | 2/2001 | Yasuaki | |
| 6,421,277 B2 * | 7/2002 | Tsunesada | 365/185.24 |
| 6,459,612 B2 * | 10/2002 | Satoh et al. | 365/185.03 |
| 6,483,745 B2 * | 11/2002 | Saeki | 365/185.04 |
| 6,496,418 B2 * | 12/2002 | Kawahara et al. | 365/185.24 |

FOREIGN PATENT DOCUMENTS

| | | |
|---|---|---|
| EP | 0 911 833 | 4/1999 |
| EP | 1 182 669 | 2/2002 |
| JP | 9-035488 | 2/1997 |
| JP | 9-306182 | 11/1997 |
| JP | 11-154394 | 6/1999 |

OTHER PUBLICATIONS

Jung, T.–S. et al (Nov. 1996). "A 117–mm$^2$ 3.3–V Only 128–Mb Multilevel NAND Flash Memory for Mass Storage Applications," *IEEE Journal of Solid-State Circuits* 31(11):1575–1583.

European Search Report mailed Dec. 30, 2003, for European Publication No. 0 302 011, 3 pages.

* cited by examiner

*Primary Examiner*—Trong Phan
(74) *Attorney, Agent, or Firm*—Morrison & Foerster LLP

(57) ABSTRACT

A non-volatile semiconductor memory device is provided, which comprises a memory array comprising memory cells, in which each memory cell is capable of storing data values depending on the voltages thereof, the data values include a first data value corresponding to a first voltage range and a second data value corresponding to a second voltage range, and the first data is written in a memory cell of the memory cells, a determination section for determining whether a voltage value of the memory cell is higher or lower than a reference value set between a maximum value and a minimum value of the first voltage range, and a rewrite section for rewriting the first data into the memory cell based on a determination result of the determination section so that a margin between the first voltage range and the second voltage range in the memory cell is enlarged.

20 Claims, 10 Drawing Sheets

NON-VOLATILE SEMICONDUCTOR MEMORY DEVICE AND REWRITING METHOD

BACKGROUND OF THE INVENTION

1. Field of the Invention

The present invention relates to a non-volatile semiconductor memory device and a method for rewriting data thereto. More particularly, the present invention relates to a non-volatile semiconductor memory device suitable for multi-value flash memories, such as flash EEPROM (Electrically Erasable and Programmable Read Only Memory) and the like, and a method for rewriting data thereto.

2. Description of the Related Art

Conventionally, an electrically rewritable non-volatile semiconductor memory device, such as EEPROM, flash EEPROM, and the like, comprises a memory array in which a plurality of memory cell transistors, each of which comprises a charge accumulation layer comprising a floating gate and an insulating film between a control gate and a semiconductor substrate, are provided.

By injecting electric charges into the charge accumulation layer or discharging electric charges from the charge accumulation layer, the threshold voltage Vth of the memory cell transistor is changed. By changing the threshold voltage Vth of the memory cell transistor in that manner, data is written into the memory cell transistor and the memory cell transistor stores the written data.

In order to write data into the memory cell transistor, for example, a voltage of 0 V is applied to a source diffusion region provided in the semiconductor substrate, a voltage of about 5 V is applied to a drain diffusion region, and a pulse voltage of about 12 V is applied to the control gate. In this case, the floating gate is not electrically fixed and is floating.

When a pulse voltage is applied to the control gate, the memory cell transistor is turned ON so that an electric current flows between the source and the drain. The electric current generates hot electrons. The hot electrons (i.e., electric charges) are injected into the floating gate and are accumulated therein. When the electrons are injected into the floating gate, the threshold voltage Vth of the memory cell transistor controlled by the control gate is increased. By associating the threshold voltage Vth with data "1" or "0", two-value data can be stored in the memory cell transistor.

FIG. 9 is a graph showing the threshold voltage distribution of memory cell transistors in a two-value memory.

FIG. 9 shows the threshold voltage distribution of memory cell transistors when electrons are not injected into the floating gates thereof (corresponding to the left-hand distribution indicated by reference numeral 92) and the threshold voltage distribution of memory cell transistors when electrons are injected to the floating gates thereof (corresponding to the right-hand distribution indicated by reference numeral 94). Note that in the graph of FIG. 9, the horizontal axis represents the threshold voltage Vth of a memory cell transistor, while the vertical axis represents the number of memory cell transistors indicating a threshold voltage Vth (i.e., the number of bits).

One data value corresponds to one threshold voltage distribution. Threshold voltages corresponding to one data value are distributed in a certain range. As used herein, such a range is referred to as threshold voltage range.

The threshold voltage of a memory cell transistor is relatively low, as indicated by reference numeral 92, when electric charges are not injected into the floating gate thereof. The threshold voltage of a memory cell transistor is relatively high, as indicated by reference numeral 94, when electric charges are injected into the floating gate thereof.

Therefore, when a determination voltage which is located between the two threshold voltage ranges is applied to the control gate, a memory cell transistor whose floating gate does not receive injected electric charges (i.e., a memory cell transistor having the distribution indicated by reference numeral 92) is turned ON and a read electric current flows therethrough, and a memory cell transistor whose floating gate receives injected electric charges (i.e., a memory cell transistor having the distribution indicated by reference numeral 94) is turned OFF and a read electric current does not flow therethrough.

By detecting the presence or absence of the read electric current using a sense circuit, the sense circuit can read out data stored in a memory cell transistor as "0" or "1", depending on the threshold voltage thereof. Thus, the ON/OFF state of a memory cell transistor is changed depending on a change in threshold voltage caused by electric charge injection into the charge accumulation layer (more specifically, floating gate) of the memory cell transistor, so that the threshold voltage of the memory cell transistor can be associated with data.

In recent years, a so-called multi-value memory technology has been proposed in which by regulating the amount of electric charges injected into a floating gate, more data values can be written into one memory cell transistor.

Such a multi-value flash memory is described in, for example, "IEEE Journal of Solid-State Circuits Vol. 31, No. 11", November 1996, pp. 1575–1583. In the case of a four-value memory, for example, there are four threshold voltage distributions. Three determination voltages, each of which is located between two adjacent threshold voltage distributions among the four threshold voltage distributions, are applied to a word line connected to a control gate. Specifically, three read operations are carried out. In this case, an operation similar to the read operation of the two-value memory is carried out three times while changing the value of a determination voltage applied to a word line.

FIG. 10 is a graph showing the distribution of the threshold voltages Vth of memory cell transistors in a four-value memory. Note that in FIG. 10, the horizontal axis represents the threshold voltage Vth of a memory cell transistor, while the vertical axis represents the number of memory cell transistors indicating a threshold voltage Vth (i.e., the number of bits).

The threshold voltage of a memory cell transistor whose floating gate does not receive injected electric charges is relatively low as indicated by the left-hand most distribution in FIG. 10 (reference numeral 102). The threshold voltages of memory cell transistors whose floating gate receives injected electric charges are relatively increased with an increase in the amount of electric charges injected into the floating gate as indicated by right-hand distributions in FIG. 10 (reference numerals 104, 106, and 108).

It is now assumed that a certain determination voltage is applied to the control gate. If the threshold voltage of a memory cell transistor is lower than the determination voltage, the memory cell transistor is turned ON and a read electric current flows therethrough. If the threshold voltage of a memory cell transistor is higher than the determination voltage, the memory cell transistor is turned OFF and a read electric current does not flow therethrough. The three determination voltages are each applied, and the presence or absence of a read electric current is detected using a sense circuit. Thus, data stored in the memory cell transistor can be read, i.e., it can be determined which value the data has among the four values.

In general, the following phenomenon is known. Electrons are injected into the floating gate of a memory cell transistor so that the threshold voltage Vth of a memory cell transistor is increased to a prescribed value. Thereafter, the memory cell transistor is allowed to be idle. As the idle time is increased, the threshold voltage Vth of the memory cell transistor is shifted toward a lower value.

FIG. 11 is a graph showing that the threshold voltage Vth of a memory cell transistor is shifted as the idle time t of the memory cell transistor is increased. Note that in FIG. 11, the horizontal axis represents an idle time t, while the vertical axis represents a threshold voltage Vth.

As shown in FIG. 11, when the idle time of a memory cell transistor reaches t0, the threshold voltage Vth of the memory cell transistor is shifted to a level which is lower by a voltage ΔVth than the written threshold voltage Vth.

A cause of such a shift phenomenon is that electric charges (electrons) which have been injected to the floating gate of a memory cell transistor is discharged (leaked) from the floating gate over time. The leakage of electric charges from the floating gate can be suppressed to some extent by improving materials for the memory cell transistor. However, as the miniaturization of semiconductor memories is proceeding, the likelihood of electric charge leakage increases and the shift phenomenon is more likely to occur.

Hereinafter, a problem with the shift phenomenon of the threshold voltage Vth of a memory cell transistor will be described with reference to FIGS. 9 and 10.

As described above, as the amount of injected electric charges is increased, the threshold voltage Vth increases. As time goes, electrons are discharged from the floating gate of a memory cell transistor, so that the threshold voltage Vth of the memory cell transistor is shifted down, i.e., the threshold voltage Vth becomes lower.

In the case of a multi-value memory capable of storing three or more data values in one memory cell transistor, a margin between adjacent threshold voltage ranges is considerably small as shown in FIG. 10, and the shift of a threshold voltage Vth becomes not ignorable over time. A threshold voltage Vth corresponding to a certain data value may be shifted into a threshold voltage range corresponding to another data value. In such a case, if data stored in the memory cell transistor is read out, the data is departed from the original written data of the memory cell transistor due to the shift of the threshold voltage Vth.

In the case of two-value memories, as shown in FIG. 9, since the margin between adjacent threshold voltage ranges is relatively large, even a relatively large shift of a threshold voltage Vth is tolerable and has a small influence on data read.

However, when a power source voltage is reduced and the margin between adjacent threshold voltage ranges is not sufficient, a threshold voltage Vth is shifted toward a lower level over time as in multi-value memories, so that a threshold voltage Vth corresponding to a certain data value is shifted into a threshold voltage range corresponding to another data value. Also, in this case, if data stored in the memory cell transistor is read out, the data is departed from the original written data of the memory cell transistor due to the shift of the threshold voltage Vth.

In these circumstances, for example, Japanese Laid-Open Publication No. 9-35488 discloses a technique for preventing the alteration of data due to the shift of a threshold voltage over time. According to this conventional technique, a refresh function block is incorporated into a non-volatile semiconductor memory device. The refresh function block measures an elapsed time from the time of the last write operation for each memory chip or memory sector and compares the elapsed time with a prescribed limit of the electric charge holding time. If the elapsed time reaches the limit of the electric charge holding time, data is rewritten into each memory chip or memory sector.

Japanese Laid-Open Publication No. 9-306182 discloses a technique in which when a change in threshold voltage is detected in a specific memory cell transistor, data is written again into the memory cell transistor. Specifically, a detection means is used to determine whether or not a specific memory cell transistor has a threshold voltage at a detection point a prescribed distance away in a predetermined direction from the distribution of the threshold voltage immediately after a write operation. The data rewrite operation is carried out in the following manners: (1) data is erased and thereafter the original data is rewritten, or (2) a change in the threshold voltage of a memory cell transistor is compensated for without erasing data to recover the original data.

Japanese Laid-Open Publication No. 11-154394 discloses the following technique. An appropriate threshold voltage of a memory cell transistor is divided into a range corresponding to a permission state for data storage and a range corresponding to a forbidden zone indicating erroneous data. When a threshold voltage is shifted into the forbidden zone, a refresh operation is carried out to program the threshold voltage to the permission state. In the refresh operation, data in a memory cell is temporarily saved into a buffer, the data in the memory cell block is erased, and the data is rewritten from the buffer into the memory cell block. Such a rewrite operation is carried out by repeating a normal data write operation and a verify operation.

As used herein, the term "verify" means to investigate whether or not data is written as is originally expected.

Japanese Laid-Open Publication Nos. 9-35488, 9-306182, and 11-154394 only describe that a change (shift) in threshold voltage is compensated for by repeating a normal data write operation and a verify operation. No specific method is illustrated.

Typically, a verify operation expends much time and effort. Therefore, the above-described repeating operation requires a relatively long time (about 10 $\mu$s).

The above-described publications do not describe the level of a threshold voltage which is used to rewrite data.

SUMMARY OF THE INVENTION

According to an aspect of the present invention, a non-volatile semiconductor memory device is provided, comprising: a memory array comprising a plurality of memory cells, wherein each of the plurality of memory cells is capable of storing a plurality of data values depending on the voltages thereof, the plurality of data values include a first data value corresponding to a first voltage range and a second data value corresponding to a second voltage range, and the first data is written in one memory cell of the plurality of memory cells; a determination section for determining whether a voltage value of the one memory cell is higher or lower than a reference value set between a maximum value and a minimum value of the first voltage range; and a rewrite section for rewriting the first data into the one memory cell based on a determination result of the determination section so that a margin between the first voltage range and the second voltage range in the one memory cell is enlarged.

In one embodiment of this invention, the rewrite section shifts the voltage value of the one memory cell based on the determination result of the determination section so as to narrow the first voltage range.

In one embodiment of this invention, the rewrite section shifts the voltage value of the one memory cell by a prescribed value based on the determination result of the determination section.

In one embodiment of this invention, if the determination section determines that the voltage value of the one memory cell is lower than the reference value set between the maximum value and the minimum value of the first voltage range, the rewrite section increases the voltage value of the one memory cell by the prescribed value.

In one embodiment of this invention, if the determination section determines that the voltage value of the one memory cell is higher than the reference value set between the maximum value and the minimum value of the first voltage range, the rewrite section decreases the voltage value of the one memory cell by the prescribed value.

In one embodiment of this invention, the rewrite section shifts the voltage value of the one memory cell based on the determination result of the determination section so that the voltage value of the one memory cell is included in a range of the first voltage range on one side thereof relative to the reference value.

In one embodiment of this invention, each of the plurality of memory cells is a memory cell transistor comprising a charge accumulation layer for accumulating electric charges; and the memory cell transistor is capable of storing a plurality of data values depending on the amount of the electric charges accumulated in the charge accumulation layer.

In one embodiment of this invention, the rewrite section shifts the voltage value of the one memory cell by applying a write signal having a prescribed pulse width to the one memory cell.

In one embodiment of this invention, the reference value is set to a middle value of the first voltage range.

In one embodiment of this invention, the prescribed value is set to a difference value between the maximum value of the first voltage range and the reference value.

In one embodiment of this invention, the prescribed value is set to a difference value between the minimum value of the first voltage range and the reference value.

In one embodiment of this invention, the minimum value of the first voltage range is higher than a maximum value of the second voltage range; and the prescribed value is set to a difference value between the minimum value of the first voltage range and a determination value indicating a determination voltage for distinguishing the first voltage range from the second voltage range.

In one embodiment of this invention, the determination value is set to a middle value between the first voltage range and the second voltage range.

In one embodiment of this invention, the maximum value of the first voltage range is lower than a minimum value of the second voltage range; and the prescribed value is set to a difference value between the maximum value of the first voltage range and a determination value indicating a determination voltage for distinguishing the first voltage range from the second voltage range.

In one embodiment of this invention, the determination value is set to a middle value between the first voltage range and the second voltage range.

According to another aspect of the present invention, a rewriting method for a non-volatile semiconductor memory device is provided, comprising the steps of: reading a voltage of a memory cell capable of storing a plurality of data values depending on the voltage thereof, wherein the plurality of data values include a first data value corresponding to a first voltage range and a second data value corresponding to a second voltage range, and the first data is written in the memory cell; determining whether a value of the voltage of the memory cell is higher or lower than a reference value set between a maximum value and a minimum value of the first voltage range; and rewriting the first data into the memory cell based on a determination result of the determining step so that a margin between the first voltage range and the second voltage range in the memory cell is enlarged.

In one embodiment of this invention, the rewriting step comprises shifting the voltage value of the memory cell so that the voltage value of the memory cell is higher than the reference value if the determining step determines that the voltage value of the memory cell is smaller than the reference value set between the maximum value and the minimum value of the first voltage range.

In one embodiment of this invention, the rewriting step comprises shifting the voltage value of the memory cell so that the voltage value of the memory cell is smaller than the reference value if the determining step determines that the voltage value of the memory cell is higher than the reference value set between the maximum value and the minimum value of the first voltage range.

In one embodiment of this invention, the memory cell is a memory cell transistor comprising a charge accumulation layer for accumulating electric charges; and the rewriting step comprises reinjecting electric charges into the charge accumulation layer.

In one embodiment of this invention, the rewriting step comprises shifting the voltage value of the memory cell by applying a write signal having a prescribed pulse width to the memory cell.

Functions of the present invention will be described below.

According to the present invention, a memory cell is capable of storing a plurality of data values including a first data value corresponding to a first voltage range and a second data value corresponding to a second voltage range. It is determined whether the voltage value of the memory cell, in which the first data value has been written, is higher or lower than a reference value set between the maximum value and minimum value of the first voltage range. Based on a result of the determination, the first data is rewritten into the memory cell so that a margin between the first voltage range and the second voltage range is enlarged. Thus, by enlarging a margin between the first voltage range and the second voltage range based on the result of determination whether the voltage value of the memory cell is higher or smaller than the reference value, the data holding time of a memory cell can be elongated.

A transistor having a charge accumulation layer (a floating gate and an insulating film) is used as a memory cell, i.e., a memory cell transistor. By injecting electric charges into the charge accumulation layer to regulate the threshold voltage of the memory cell transistor, one data value or two or more data values is written into the memory cell transistor. In this case, threshold voltages corresponding to the same data value are distributed between the maximum value and the minimum value, due to variations in memory cell transistors or chips comprising the memory cell transistors, where the maximum frequency is located at the middle value or in the vicinity thereof. The threshold voltage distribution is shifted in a certain direction since electric charges are discharged from the charge accumulation layer over time. Thus, if the threshold voltage is shifted into a threshold voltage range corresponding to a data value different from that when a data write operation has been carried out, a data value different from the written data value is read out.

In general, leakage of electric charges due to idle causes the threshold voltage to be shifted to a lower value. An embodiment of the present invention provides a solution to avoid this as follows. The threshold voltage value is compared with a reference value set within a threshold voltage range. If the threshold voltage value is lower than the reference value, are write operation is not carried out. Only if the threshold voltage value is higher than the reference value, a rewrite operation (reinjection of electric charges) is carried out so that the threshold voltage value is increased by the prescribed value, i.e., the threshold voltage is shifted to a higher level. Thus, even if the threshold voltage is subsequently shifted down to some degree over time, the period of time during which the threshold voltage is maintained within the written threshold voltage range can be elongated.

Alternatively, the threshold voltage of a memory cell may be shifted to a higher level, since, for example, electric charges are leaked to the memory cell from other parts of the device. The present invention also provides a solution to avoid this. The threshold voltage value is compared with a reference value set within a threshold voltage range. If the threshold voltage value is lower than the reference value, are write operation is not carried out. Only if the threshold voltage value is higher than the reference value, a rewrite operation (redischarge of electric charges) is carried out so that the threshold voltage value is decreased by a prescribed value, i.e., the threshold voltage is shifted to a lower level. Thus, even if the threshold voltage is subsequently shifted up to some degree over time, the period of time during which the threshold voltage is maintained within the written threshold voltage range can be elongated.

For memory cells, a small (narrow) variation (distribution) in threshold voltage is preferable. A sufficient margin between adjacent threshold voltage ranges is preferable, particularly for a multi-value memory capable of storing 3 or more data values. Therefore, there is a demand for a considerably small threshold voltage range. In other words, if the threshold voltage range is narrow, a large number of data values (multi-value) can be stored in one memory cell transistor. By storing a number of data values in one memory cell transistor, it is possible to achieve a memory array having a small size and a large capacity.

Therefore, according to the present invention, the threshold voltage value is shifted by a prescribed value to one side (higher voltage side or lower voltage side) only if the threshold voltage value is lower or higher than a reference value. Therefore, it is possible to cause the threshold voltage value to be on one side (higher side or lower side) relative to the reference value. Therefore, the threshold voltage range can be further narrowed, so that a margin between adjacent threshold voltage ranges can be enlarged and the data holding property of the memory can be improved.

The reference value to be compared with the threshold voltage can be any value between the maximum value and minimum value of the threshold voltage range. If the threshold voltage distribution is laterally symmetrical and has a peak at the middle thereof, the reference value is preferably set to the middle value (or its close values) of the threshold voltage range. Thus, the threshold voltage value of a memory cell corresponding to a certain data value can be shifted to one side (higher or lower side) of the middle value of the threshold voltage range so that the threshold voltage range can be narrowed.

The prescribed value by which the threshold voltage is shifted can be any value. For example, the prescribed value maybe set to the difference value between the maximum value and middle value (e.g., a voltage value equal to ½ of the difference between the maximum value and minimum value of threshold voltage range) of the threshold voltage range. Alternatively, the prescribed value may be set to the difference value between the minimum value of a threshold voltage range corresponding to each data value (each value in a multi-value memory) and a determination value indicating a determination voltage for distinguishing the threshold voltage range from an adjacent threshold voltage range lower (or higher) than the threshold voltage range (e.g., a voltage value equal to ½ of the difference between the maximum value and minimum value of two adjacent threshold voltage ranges).

A write signal having a prescribed pulse width may be applied to the control voltage terminal (control gate) of a memory cell transistor requiring shift, once or a desired number of times, in order to shift the threshold voltage value by a prescribed value, a refresh operation can be quickly carried out.

Therefore, the operation time required for a rewrite (refresh) operation can be reduced as compared to conventional technique in which a write operation and a verify operation are repeated.

Thus, the invention described herein makes possible the advantage of providing a non-volatile semiconductor memory device in which a quick rewrite operation is carried out so that a margin between adjacent threshold voltage ranges is increased, thereby improving the data holing property; and a rewriting method.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings. Note that only steps involved in a rewrite operation are herein described.

(Embodiment 1)

Figure 1:
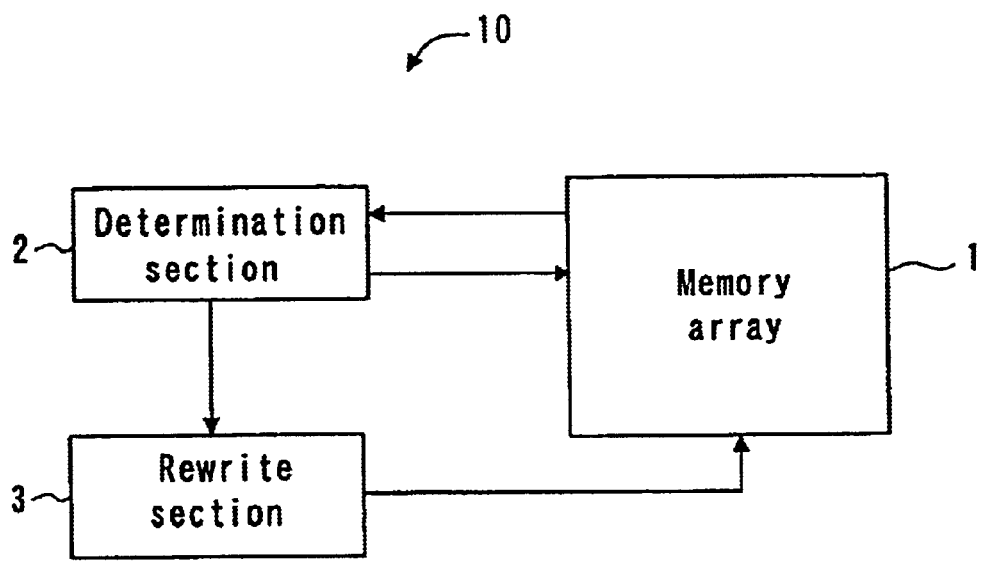
FIG. 1 is a block diagram showing a major portion of a configuration of a non-volatile semiconductor memory device according to the present invention.

FIG. 1 is a block diagram showing a major portion of a configuration of a non-volatile semiconductor memory device 10 according to the present invention.

In FIG. 1, the non-volatile semiconductor memory device 10 comprises: a memory array 1 having a plurality of memory cells, each of which can store two or more data values; a determination section 2 for determining whether the voltage value of a memory cell corresponding to a certain data value is higher or lower than a reference value preset between the maximum value and the minimum value of a voltage range corresponding the data value; and a rewrite section 3 for rewriting the data into the memory cell so that a margin between adjacent two voltage ranges is increased so as to improve the data holding property, depending on the determination result of the determination section 2.

Herein, the memory array 1 comprises memory cell transistors as memory cells. It should be noted that the memory cell in the memory array 1 is not limited to a memory cell transistor in the present invention.

Each memory cell transistor in the memory array 1 comprises a charge accumulation layer comprising a floating gate and an insulating film. The memory cell transistor can store two or more data values. By regulating the threshold voltage of a memory cell transistor by changing the amount of electric charges accumulated in the charge accumulation layer, one data value among the two or more data values is written into the memory cell.

Now, the threshold voltage of a memory cell transistor will be described.

Figure 2:
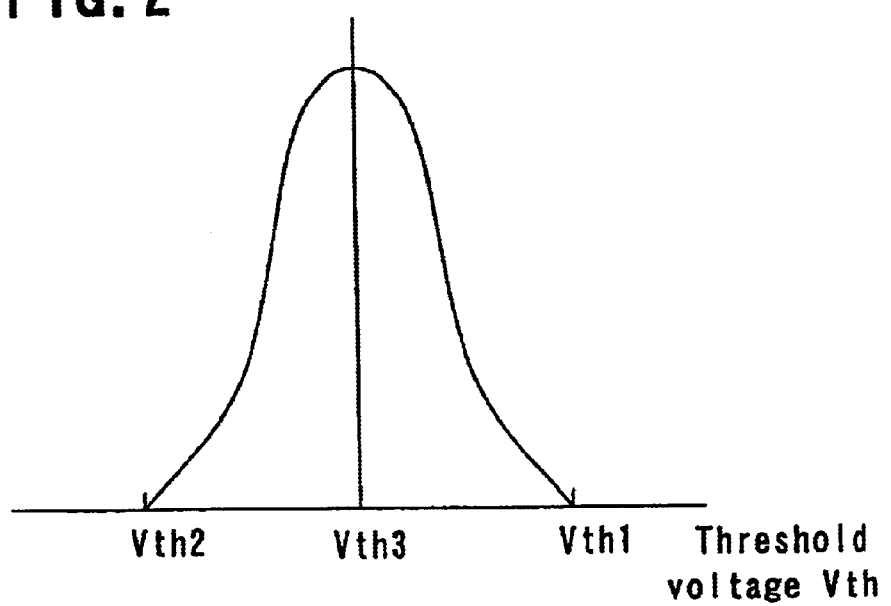
FIG. 2 is a graph showing the threshold voltage distribution of memory cell transistors.

FIG. 2 is a graph showing the threshold voltage distribution of memory cell transistors.

FIG. 2 shows the distribution of threshold voltages Vth corresponding to a certain data value when electric charges are injected into the floating gate of a memory cell transistor so as to increase the threshold voltage Vth of the memory cell transistor to a prescribed level. In the graph of FIG. 2, the horizontal axis represents the threshold voltage Vth of a memory cell transistor, while the vertical axis represents the number of memory cell transistors indicating a threshold voltage Vth (i.e., the number of bits).

As shown in FIG. 2, the threshold voltages Vth of memory cell transistors vary to some extent (i.e., distribution). The threshold voltage is considered to have a certain range corresponding to a certain data value. Hereinafter, the range is referred to as a threshold voltage range.

Herein, the maximum value (upper limit value) of the distribution range of threshold voltages Vth is indicated by Vth1, the minimum value (lower limit value) thereof is indicated by Vth2, and a middle value between the maximum value and the minimum value is indicated by Vth3= ½×(Vth1+Vth2).

When a memory cell transistor is allowed to be idle after a data write operation, the threshold voltage Vth of the memory cell transistor is shifted toward a certain direction (a low voltage direction or a high voltage direction) over time. If the threshold voltage value is shifted into an adjacent threshold voltage range corresponding to another data value, data is read as a value different from the originally written data. Therefore, it is necessary to rewrite data (data refresh).

Generally, the threshold voltage of a memory cell transistor is shifted to a lower level due to leakage of electric charges. In order to prevent this, in the following example of Embodiment 1, data is rewritten into such a memory cell transistor.

The determination section 2 compares the threshold voltage value of a memory cell transistor in the memory array 1 with a prescribed reference value to determine whether the threshold voltage value is higher or lower than the reference value.

The reference value can be set to any value between the maximum and minimum values of a threshold voltage range corresponding to a written data value in the memory cell transistor. Herein, as an example, a middle value of a threshold voltage range is used as a reference value.

The rewrite section 3 undergoes an electric charge reinjection operation for the charge accumulation layer of a memory cell transistor whose threshold voltage value is lower than the reference value to increase the threshold voltage value by a prescribed value.

The prescribed value may be set to an arbitrary value. Herein, as an example, the prescribed value is set to a difference value between the maximum value and the middle value of the threshold voltage range. In the electric charge (electrons) reinjection operation, a write signal having a prescribed pulse width Tp is applied to the control voltage terminal (control gate) of a memory cell transistor.

Hereinafter, a rewrite operation for the non-volatile semiconductor memory device 10 according to Embodiment 1 of the present invention will be described.

Figure 3:
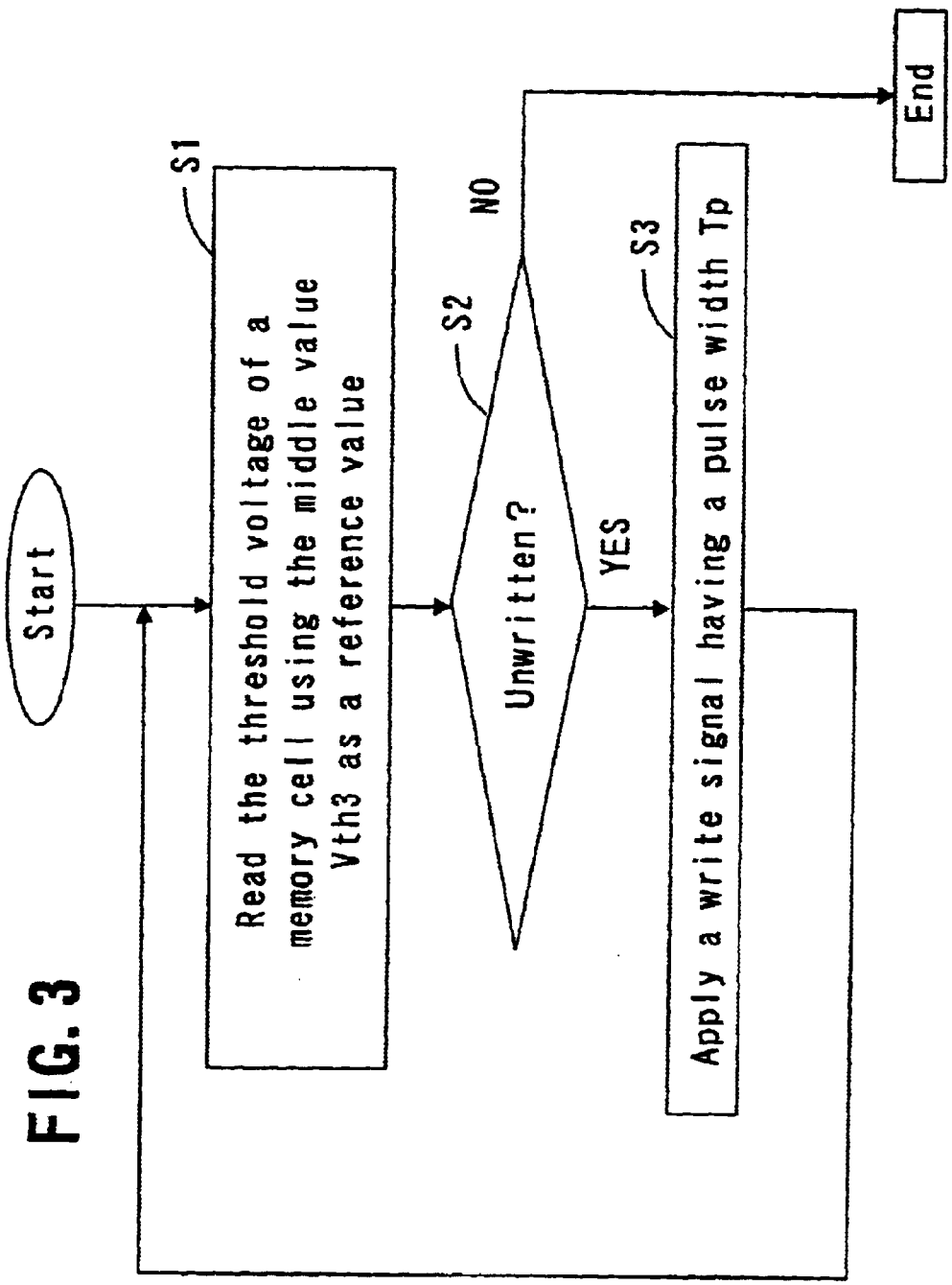
FIG. 3 is a flowchart showing a process of a rewrite operation according to Embodiment 1 of the present invention.

FIG. 3 is a flowchart showing a process of a rewrite operation according to Embodiment 1 of the present invention.

In step S1, the threshold voltage of a memory cell (e.g., a memory cell transistor) is read out, where the middle value Vth3 of the threshold voltage range corresponding to a written data value in the memory cell is used as a reference value. Here, the expression "a memory cell is read out" does not necessarily mean that the threshold voltage value of the memory cell is specified.

In step S2, it is determined whether or not the memory cell is in an unwritten state, based on the threshold voltage read out from the memory cell in step S1. Specifically, if the read threshold voltage value is lower than the middle value Vth3 of the threshold voltage range, the determination section 2 determines that the memory cell is in an unwritten state. The process goes to step S3. If the read threshold voltage value is higher than or equal to the middle value Vth3 of the threshold voltage range, the determination section 2 determines that the memory cell is already in a written state. The process is ended.

Further, in step S3, a write signal having a prescribed pulse width Tp is applied to the memory cell so that the threshold voltage value is increased by (Vth1−Vth3). Thus, it is possible to elongate the elapsed time period from the time of data write to the time at which the threshold voltage of the memory cell is decreased and shifted into an adjacent (lower) threshold voltage range corresponding to another data value. Therefore, the data holding time is also elongated.

Thereafter, the process returns to step S1, and the threshold voltage of the memory cell is read out again, where the middle value Vth3 of the threshold voltage range is used as a reference. If based on the threshold voltage read out in step S2 it is determined that the memory cell is still in an unwritten state, the process goes to step S3 and a write signal having a prescribed pulse width Tp is applied again to the memory cell so that the threshold voltage value is further increased by (Vth1−Vth3).

The operation is repeated until it is determined that the memory cell is in a written state based on the threshold voltage read out in step S2 (generally, one or two cycles). In this manner, among the plurality of memory cells included in the memory array 1, the threshold voltage, of each of the memory cells having a threshold voltage value lower than the middle value in the threshold voltage range, is shifted. Such memory cells are about a half of all the plurality of memory cells included in the memory array 1. Thus, the rewrite operation can be quickly ended.

Thus, after the end of the data rewrite operation, the threshold voltage value of the memory cell transistor falls within the range that is higher than or equal to the middle value Vth3 of the threshold voltage range and is lower than or equal to the maximum value Vth1. Therefore, the threshold voltage range after the rewrite operation is narrowed to about half compared to the threshold voltage range when data was originally written. In other words, a margin between two adjacent threshold voltage ranges is increased. Thus, the margin of data read is improved.

The threshold voltage range of the memory cell transistor after the end of the data rewrite operation is present in a higher voltage region of the threshold voltage range when data was originally written. Therefore, even if electric charge leakage subsequently occurs in the charge accumulation layer, the time period during which the threshold voltage is maintained in the tolerable range (i.e., written threshold voltage range) is elongated. As a result, the data holding time is also elongated.

Note that a method disclosed by the present inventor in Japanese Laid-Open Publication No. 2003-123487 may be employed to calculate the write signal having pulse width Tp for increasing the threshold voltage value by (Vth3−Vth2).

Figure 4:
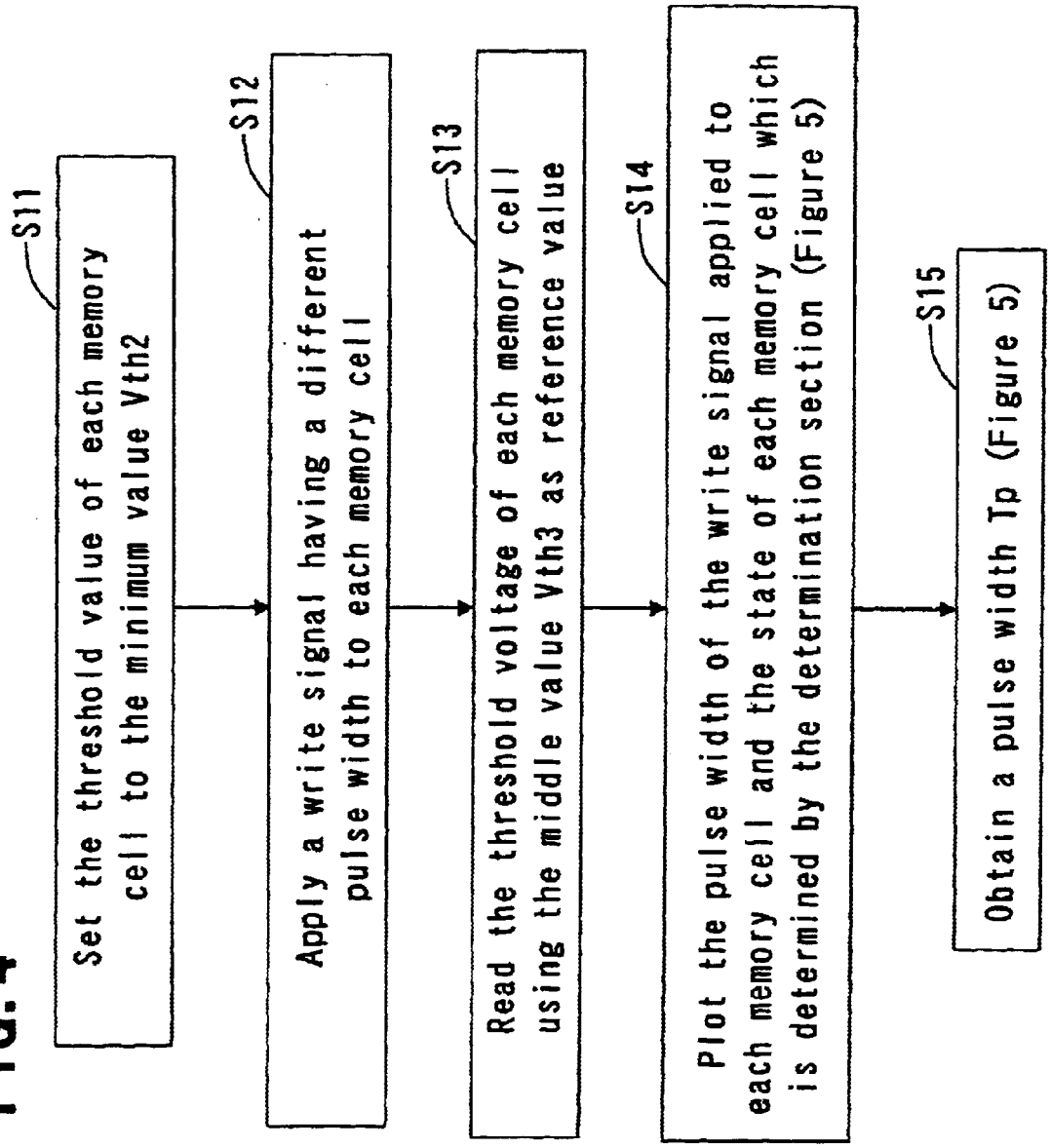
FIG. 4 is a flowchart showing a process of an operation for obtaining a pulse width of a write signal.

FIG. 4 is a flowchart showing a process of an operation for obtaining a pulse width of a write signal.

As shown in FIG. 4, in step S11, the threshold voltage of each of a plurality of memory cells (e.g., memory cell transistors) is set to the minimum voltage value Vth2 of the threshold voltage range.

In step S12, write signals having different pulse widths are applied to the plurality of memory cells.

In step S13, the threshold voltage of the plurality of memory cells are read out using the middle value Vth3 of the threshold voltage range as a reference value.

Figure 5:
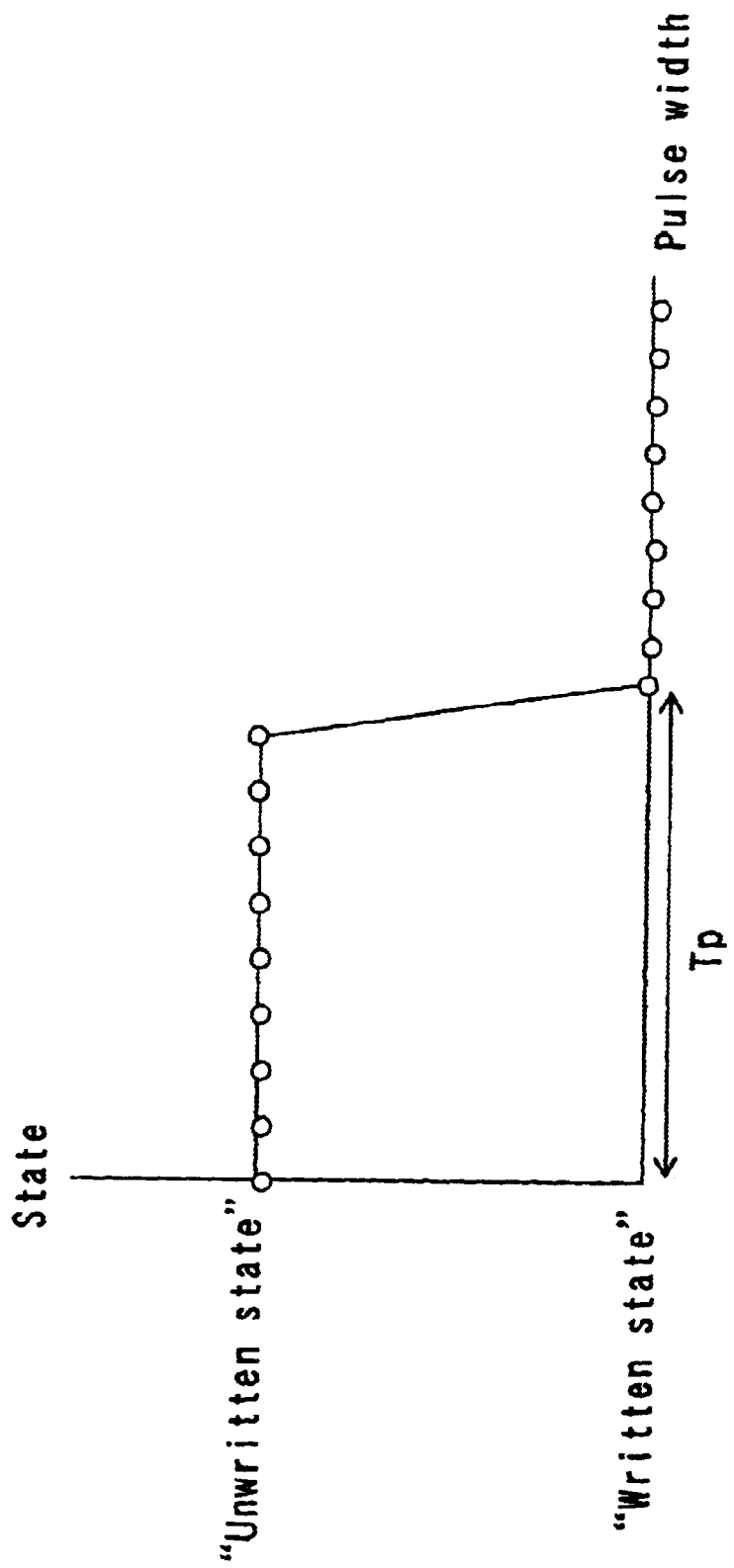
FIG. 5 is a graph for explaining a process of obtaining a pulse width of a write signal.

In step S14, the pulse width of the write signal applied to each memory cell is plotted on the horizontal axis, while the state of each memory cell which is determined by the determination section 2 (FIG. 1) based on the read threshold voltage is plotted on the vertical axis, to obtain a graph as shown in FIG. 5.

FIG. 5 is a graph for explaining a process of obtaining a pulse width of a write signal. In the finally obtained graph in FIG. 5, a pulse width Tp at which "unwritten state" is changed to "written state" is a pulse width of the write signal to be obtained.

With the above-described process, the write signal pulse width Tp may be measured, for example, when a production inspection is carried out before the shipment of non-volatile semiconductor memory devices, when an initial operation is carried out after the shipment of non-volatile semiconductor memory devices, when non-volatile semiconductor memory devices are powered ON, or the like.

By measuring the pulse width Tp of the write signal before the shipment of non-volatile semiconductor memory devices, the non-volatile semiconductor memory devices can be used in a manner similar to typical flash memories. Also, by measuring the pulse width Tp of the write signal after the shipment of non-volatile semiconductor memory devices, a write time period optimal to practical conditions, such as a power source voltage, temperature, the characteristics of a memory cell over time, and the like, can be obtained.

In the above example of Embodiment 1, in order to prevent a memory cell transistor from being shifted toward a lower voltage over time, data is rewritten into such a memory cell transistor. Embodiment 1 of the present invention is not limited to this, and is applicable to a memory cell transistor whose threshold voltage is shifted toward a higher voltage over time. In this case, a data rewrite operation may be carried out so that the threshold voltage value of a memory cell transistor is decreased by a prescribed value (e.g., Vth3−Vth2) only if the threshold voltage value of a memory cell transistor is higher than a reference value (e.g., the middle value Vth3).

(Embodiment 2)

In the rewrite operation of Embodiment 1, application of a write signal is repeated under certain conditions. Therefore, a relatively long time is sometimes required for completion of a rewrite operation. In Embodiment 2 of the present invention, an example in which a data rewrite operation is completed in a shorter time will be described.

In Embodiment 2, a rewrite operation of the following type of memory cell will be described. When data is read out from the memory cell immediately before the rewrite operation performed in Embodiment 2, the same data value as the value of written data is read out. When data is read out from the memory cell after a certain time period, a data value different from the value of the written data may be read out due to the threshold voltage of a memory cell being shifted.

Figure 6:
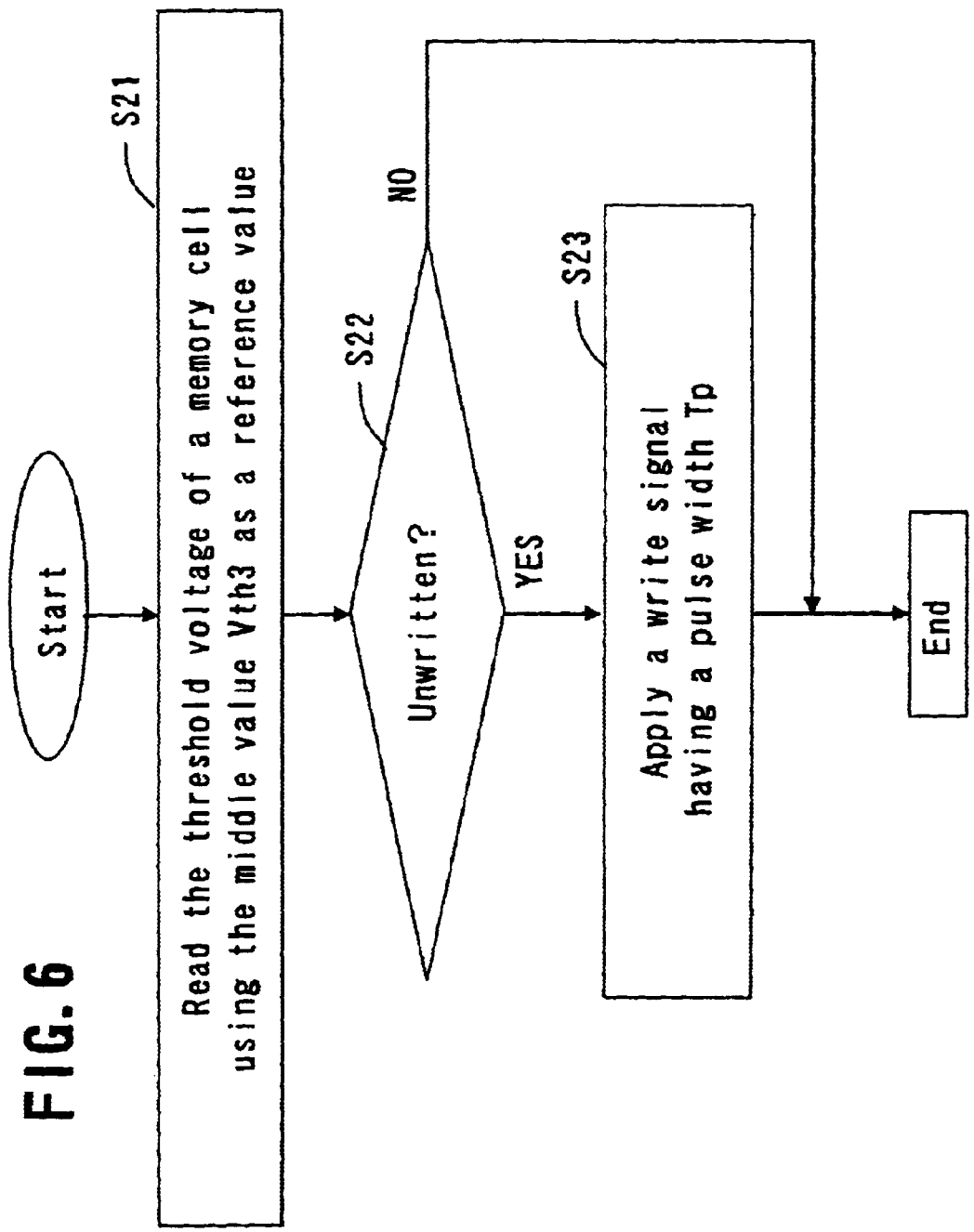
FIG. 6 is a flowchart showing a process of a rewrite operation according to Embodiment 2 of the present invention.

FIG. 6 is a flowchart showing a process of a rewrite operation according to Embodiment 2 of the present invention.

In step S21, the threshold voltage of a memory cell (e.g., a memory cell transistor) is read out, where the middle value Vth3 of a threshold voltage range corresponding to a written data value in the memory cell is used as a reference value.

In step S22, it is determined whether or not the memory cell is in an unwritten state, based on the threshold voltage read out from the memory cell in step S21. Specifically, if the read threshold voltage value is lower than the middle value Vth3 of the threshold voltage range, the determination section 2 (FIG. 1) determines that the memory cell is in an unwritten state. The process goes to step S23. If the read threshold voltage value is higher than or equal to the middle value Vth3 of the threshold voltage range, the determination section 2 determines that the memory cell is already in a written state. The process is ended. The above-described steps are the same as steps S1 and S2 of Embodiment 1 (FIG. 3), respectively.

In step S23, a write signal having a prescribed pulse width Tp is applied to the memory cell once so that the threshold voltage value is increased by a prescribed value (Vth1−Vth3: the half value of the threshold voltage range).

Figure 7:
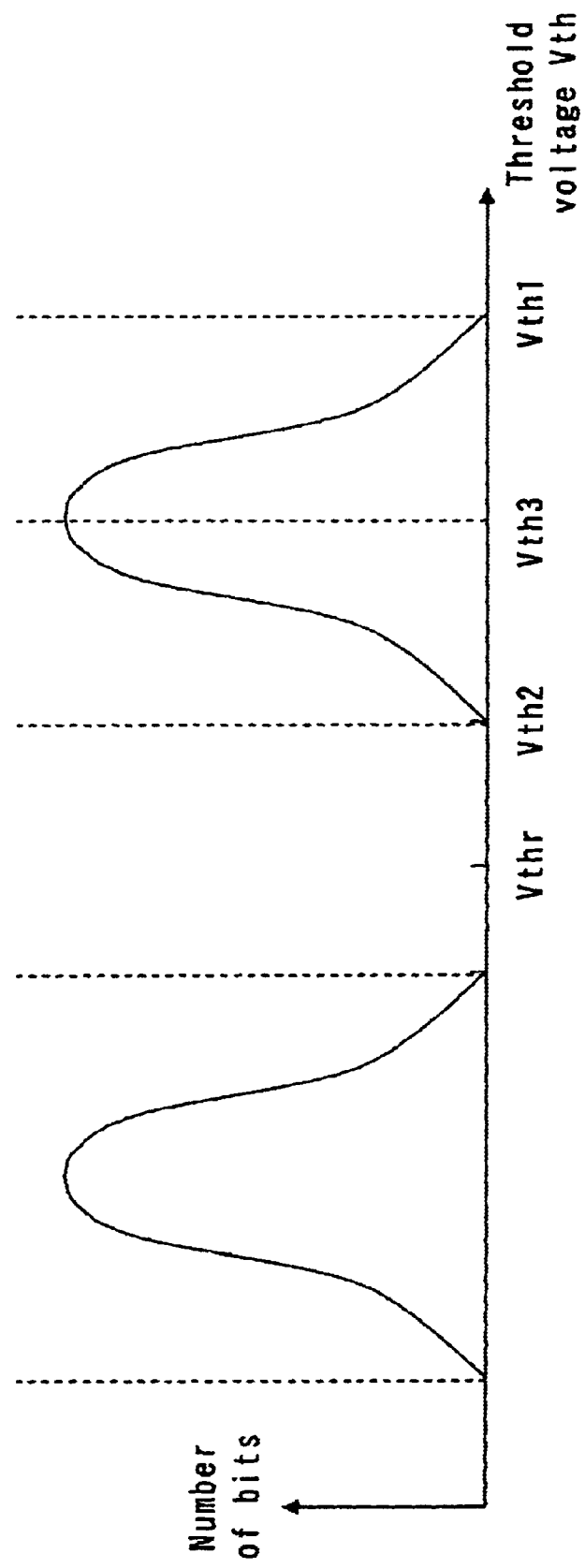
FIG. 7 is a graph showing the threshold voltage distribution of memory cell transistors.

FIG. 7 is a graph showing the threshold voltage distribution of memory cell transistors.

Typically, data stored in a certain memory cell is read out using a determination value Vthr, which is located at substantially the middle of a margin between adjacent threshold voltage ranges as shown in FIG. 7, as a reference. The determination value Vthr indicates a determination voltage, which is used to determine a data value corresponding to the threshold voltage of a memory cell. In Embodiment 2, when data is read out from the memory cell immediately before the rewrite operation, the same data value as the value of written data is read out. Therefore, the threshold voltage value of each memory cell is higher than at least the determination value Vthr.

In Embodiment 2, thus, by applying the write signal one time to increase the threshold voltage value of a memory cell by (Vth1−Vth3), the threshold voltage value of the memory cell can be shifted into the written threshold voltage range.

Specifically, among memory cells which have been determined using the determination value Vthr as a reference to have a value higher than or equal to the determination value Vthr, the lowest threshold voltage value of a memory cell is the same as the determination value Vthr. By increasing the threshold voltage value of the memory cell by (Vth1−Vth3), the threshold voltage value of the memory cell becomes higher than or equal to the minimum value Vth2 of the data written threshold voltage range. As a result, the threshold voltage value of the memory cell can be shifted into the data written threshold voltage range.

The reason will be described below.

Here, a margin between two adjacent threshold voltage ranges is lower than one threshold voltage range. In particular, this is true for multi-value memories. This is because in multi-value memories, there are a number of threshold voltage distributions corresponding to a number of data values in a prescribed power source voltage.

Therefore, the difference between the maximum value of the threshold voltage range of a memory cell and a reference value is higher than the difference value between the minimum value of the threshold voltage range of the memory cell and a determination value. This is because, particularly in multi-value memories, a margin between two adjacent threshold voltage ranges is typically lower than one threshold voltage range. This can be represented by expression (1).

$$Vth1-Vth3 > Vth2-Vthr \tag{1}$$

If (Vth1−Vth3) is added to both sides of expression (1), expression (1) is changed to expression (2) below.

$$Vthr+(Vth1-Vth3) > Vthr+(Vth2-Vthr)$$

$$Vthr+(Vth1-Vth3) > Vth2 \tag{2}$$

Thus, even if the threshold voltage value of a memory cell is the same as the determination value Vthr, by increasing the threshold voltage value of the memory cell by (Vth1−Vth3), the threshold voltage value becomes higher than the minimum value Vth2 of the threshold voltage range.

Therefore, according to Embodiment 2, a refresh operation, with which the threshold voltage value of a memory cell can be increased to a level higher than at least the minimum value of the threshold voltage range, can be quickly completed without repeating a read operation of the threshold voltage of a memory cell and a write signal applying operation (steps S1 to S3 in FIG. 3) as in Embodiment 1. In Embodiment 2, the write signal pulse width Tp can also be obtained as in Embodiment 1.

In the above example of Embodiment 2, in order to prevent a memory cell transistor from being shifted toward a lower voltage over time, data is rewritten into such a memory cell transistor. Embodiment 2 of the present invention is not limited to this, and is applicable to a memory cell transistor whose threshold voltage is shifted toward a higher voltage over time.

(Embodiment 3)

In Embodiment 3, an example in which a rewrite operation can be even more quickly carried out will be described.

Like Embodiment 2, also in Embodiment 3, a rewrite operation of the following type of memory cell will be described. when data is read out from the memory cell immediately before the rewrite operation performed in Embodiment 3, the same data value as the value of written data is read out. When data is read out from the memory cell after a certain time period, a data value different from the value of the written data may be read out due to the threshold voltage of a memory cell being shifted.

Figure 8:
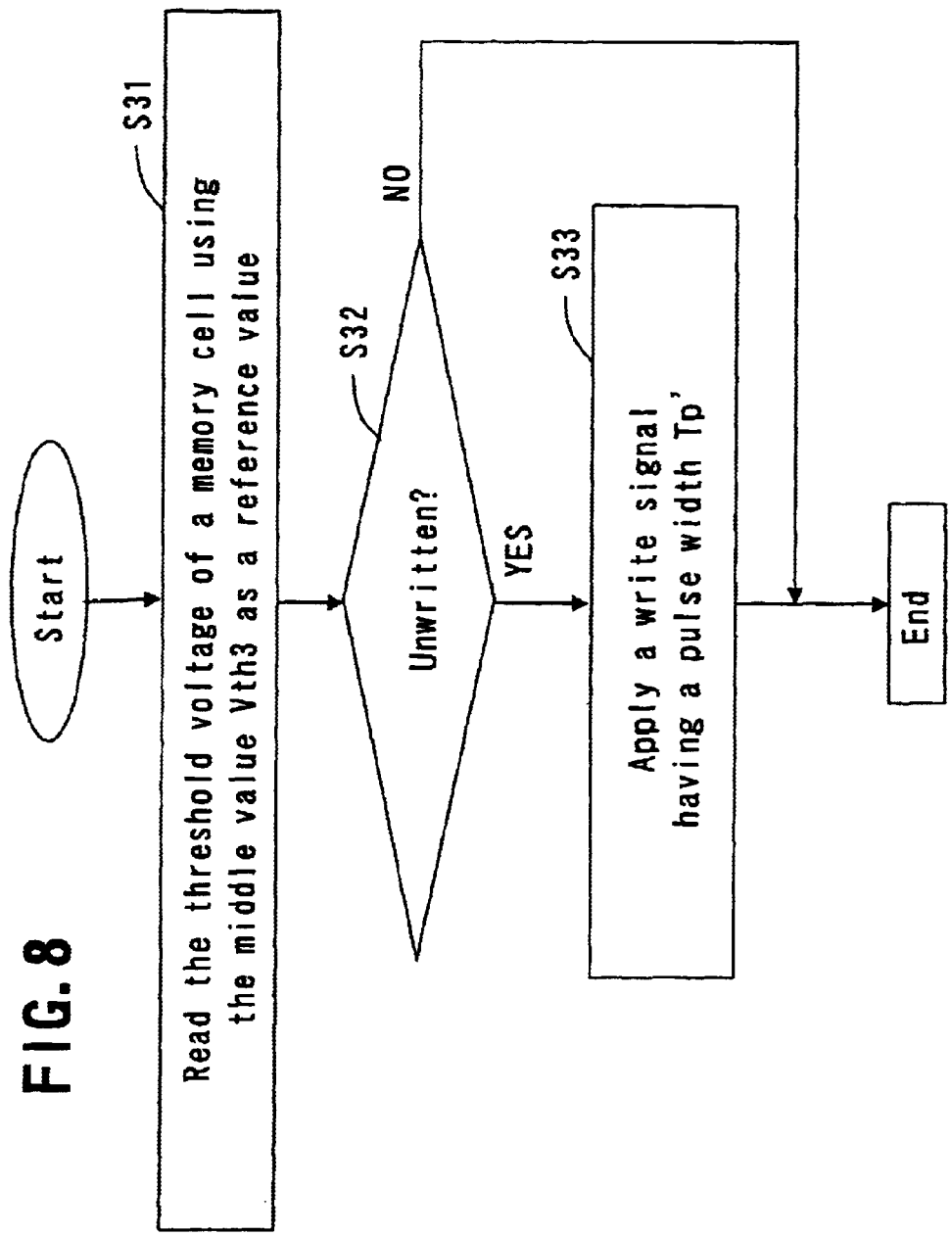
FIG. 8 is a flowchart showing a process of a rewrite operation according to Embodiment 3 of the present invention.
Figure 9:
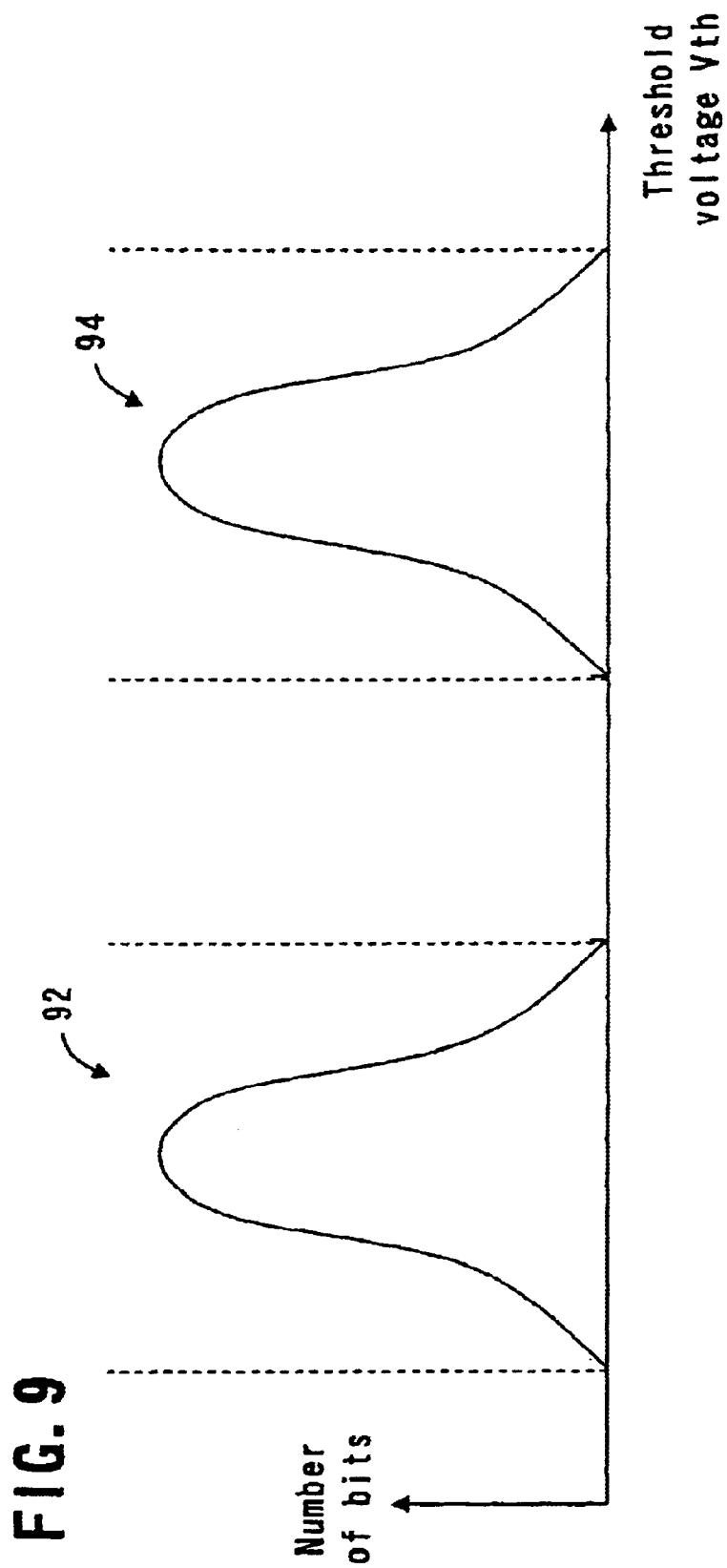
FIG. 9 is a graph showing the threshold voltage distribution of memory cell transistors in a two-value memory.
Figure 10:
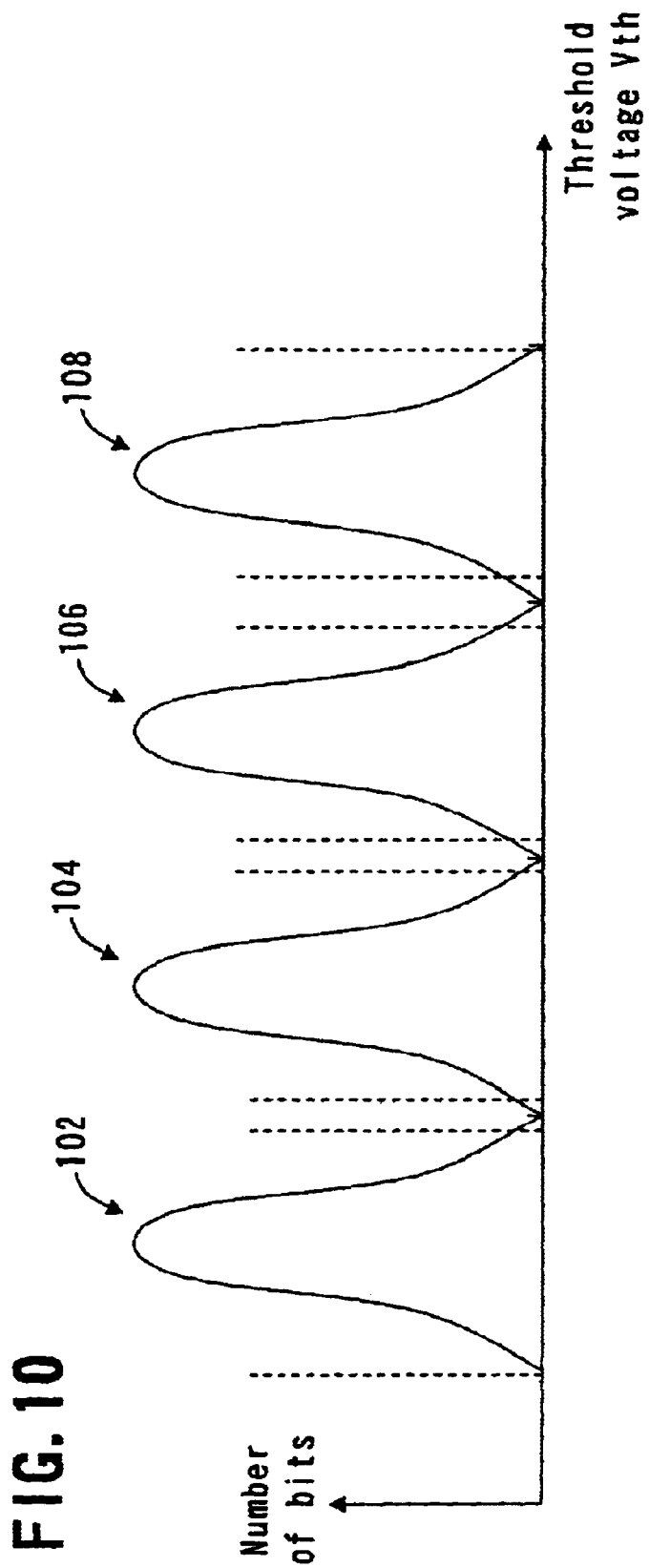
FIG. 10 is a graph showing the distribution of the threshold voltages Vth of memory cell transistors in a four-value memory.
Figure 11:
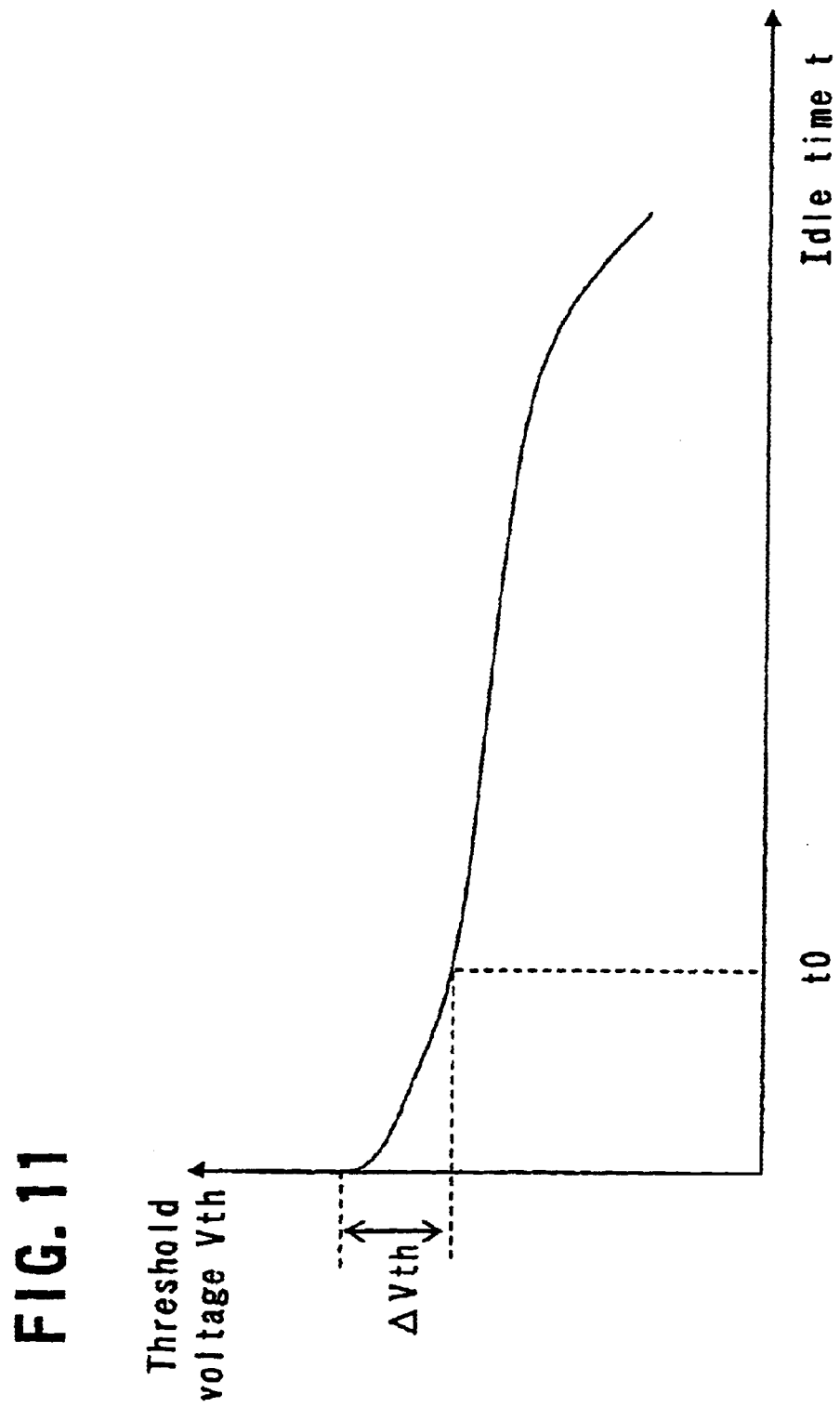
FIG. 11 is a graph showing that the threshold voltage Vth of a memory cell transistor is shifted as the idle time of the memory cell transistor is increased.

FIG. 8 is a flowchart showing a process of a rewrite operation according to Embodiment 3 of the present invention.

In step S31, the threshold voltage of a memory cell (e.g., a memory cell transistor) is read out, where the middle value Vth3 of a threshold voltage range corresponding to a written data value in the memory cell is used as a reference value.

In step S32, it is determined whether or not the memory cell is in an unwritten state, based on the threshold voltage read out from the memory cell in step S31. Specifically, if the read threshold voltage value is lower than the middle value Vth3 of the threshold voltage range, the determination section 2 (FIG. 1) determines that the memory cell is in an unwritten state. The process goes to step S33. If the read threshold voltage value is higher than or equal to the middle value Vth3 of the threshold voltage range, the determination section 2 determines that the memory cell is already in a written state. The process is ended. The above-described steps are the same as steps S1 and S2 of Embodiment 1 (FIG. 3), respectively.

In step S33, a write signal having a prescribed pulse width Tp' is applied to the memory cell once so that the threshold voltage value is increased by a prescribed value (Vth2−Vthr).

As described in Embodiment 2, typically, data stored in a certain memory cell is read out using a determination value Vthr, which is located at substantially the middle of a margin between adjacent threshold voltage ranges as shown in FIG. 7, as a reference. The determination value Vthr indicates a determination voltage, which is used to determine a data value corresponding to the threshold voltage of a memory cell. In Embodiment 3, when data is read out from the memory cell immediately before the rewrite operation, the same data value as the value of written data is read out. Therefore, the threshold voltage of a memory cell is higher than at least the determination value Vthr.

In Embodiment 3, thus, by applying the write signal one time to increase the threshold voltage value of a memory cell by (Vth2−Vthr), the threshold voltage value of the memory cell can be shifted into the written threshold voltage range.

The pulse width Tp' of the write signal for increasing a threshold voltage value by (Vth2−Vthr) is typically lower than the write pulse width Tp in Embodiments 1 and 2.

Therefore, the refresh operation can be even more quickly completed. The pulse width Tp' of the write signal can be obtained in a manner similar to that for the pulse width Tp.

Although in the above example of Embodiment 3, data is rewritten into a memory cell transistor whose threshold voltage is shifted toward a lower voltage over time, Embodiment 3 of the present invention is not limited to this.

According to Embodiment 3, in order to prevent a memory cell transistor from being shifted toward a higher voltage over time, data may be rewritten into such a memory cell transistor. In this case, if the threshold voltage value of the memory cell transistor is higher than a reference value (e.g., the middle value Vth3), a data rewrite operation may be carried out so that the threshold voltage value of a memory cell transistor is decreased by a prescribed value. For example, the prescribed value is a difference value between the determination value (located at a substantially middle of a margin between one threshold voltage range and another threshold voltage range adjacent thereto on the higher voltage side) and the maximum value of the one threshold voltage range. Namely, the prescribed value is the determination value Vthr−Vth1.

As described above, in Embodiments 1 to 3, the memory array 1 comprises a plurality of memory cell transistors each having a charge accumulation layer. By changing the amount of electric charges accumulated in the charge accumulation layer, the threshold voltage of a memory cell transistor is regulated, so that one of two or more data values is written into a memory cell transistor. It is determined whether the threshold voltage value of each memory cell transistor is higher or lower than a reference value, e.g., the middle value of the threshold voltage range corresponding to a written data value in the memory cell transistor. If the threshold voltage value is lower than the middle value, electric charges are reinjected again to the charge accumulation layer so that the threshold voltage value of the memory cell transistor is increased by the difference value (prescribed value) between the maximum value and middle value of the threshold voltage range. Thus, a change in threshold voltage can be compensated for in a shorter time. Also, by shifting the threshold voltage distribution upward relative to the reference value within the threshold voltage range, a margin between adjacent threshold voltage ranges can be enlarged and therefore the data holding property can be improved.

Note that although in Embodiments 1 to 3 the reference value is set to the middle value of a threshold voltage range, the present invention is not limited to this. In the present invention, the reference value may be set to any value between the maximum and minimum values of the threshold voltage range. For example, the reference value may be the value of $1/3, 1/4, \ldots, 1/n$ of the threshold voltage range plus the minimum value of the voltage range, where n is a natural number of 3 or more.

In Embodiments 1 to 3, a prescribed value for shifting the displaced threshold voltage of a memory cell transistor is set to: (1) the difference value between the maximum value of the threshold voltage range and the reference value; (2) the difference value between the minimum value of the threshold voltage range and the reference value; (3) the difference value between the minimum value of the threshold voltage range and a determination voltage for distinguishing the threshold voltage range from a lower threshold voltage range adjacent to the threshold voltage range; and (4) the difference value between the maximum value of the threshold voltage range and a determination voltage for distinguishing the threshold voltage range from a higher threshold voltage range adjacent to the threshold voltage range. The present invention is not limited to this.

In the present invention, the prescribed value may be any value as long as it can enlarge a margin between two threshold voltage ranges corresponding to two data values. Even if a change in threshold voltage during the idle period is relatively small and the threshold voltage value of one memory cell is close to a reference value, the threshold voltage of the memory cell after a rewrite operation needs to be within the data written threshold voltage range. In this case, the same data as the written data can be read out.

Note that although in the above-described memory cells, data is stored depending on the threshold voltage of each memory cell, the present invention is not limited to such memory cells. The present invention is applicable to memory cells capable of storing a plurality of data values depending on voltage.

As described above, according to the present invention, a memory array is provided, in which by injecting electric charges into a charge accumulation layer, the threshold voltage of a memory cell transistor is regulated so that one value among two or more straggle data values is written into the memory cell transistor. In this memory array, data is rewritten (reinjection of electric charges or redischarge of electric charges) so that the threshold voltage value is increased (or decreased) by a prescribed value and thus the threshold voltage is shifted to compensate for a change in threshold voltage, only if the threshold voltage, which has been shifted over time, is lower (or higher) than a prescribed reference value. Since the threshold voltage is shifted to a level higher (or lower) than the reference value, the threshold voltage range can be narrowed so that the data holding property of a memory can be improved. In addition, since a write signal having a prescribed pulse width is applied to a memory cell transistor requiring shift, once or a desired number of times, in order to shift the threshold voltage value by a prescribed value, a refresh operation can be quickly carried out.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile semiconductor memory device, comprising:
    a memory array comprising a plurality of memory cells, wherein each of the plurality of memory cells is capable of storing a plurality of data values depending on the voltages thereof, the plurality of data values include a first data value corresponding to a first voltage range and a second data value corresponding to a second voltage range, and the first data is written in one memory cell of the plurality of memory cells;
    a determination section for determining whether a voltage value of the one memory cell is higher or lower than a reference value set between a maximum value and a minimum value of the first voltage range; and
    a rewrite section for rewriting the first data into the one memory cell based on a determination result of the determination section so that a margin between the first voltage range and the second voltage range in the one memory cell is enlarged.

2. A non-volatile semiconductor memory device according to claim 1, wherein the rewrite section shifts the voltage value of the one memory cell based on the determination result of the determination section so as to narrow the first voltage range.

3. A non-volatile semiconductor memory device according to claim 2, wherein the rewrite section shifts the voltage value of the one memory cell by a prescribed value based on the determination result of the determination section.

4. A non-volatile semiconductor memory device according to claim 3, wherein if the determination section determines that the voltage value of the one memory cell is lower than the reference value set between the maximum value and the minimum value of the first voltage range, the rewrite section increases the voltage value of the one memory cell by the prescribed value.

5. A non-volatile semiconductor memory device according to claim 3, wherein if the determination section determines that the voltage value of the one memory cell is higher than the reference value set between the maximum value and the minimum value of the first voltage range, the rewrite section decreases the voltage value of the one memory cell by the prescribed value.

6. A non-volatile semiconductor memory device according to claim 1, wherein the rewrite section shifts the voltage value of the one memory cell based on the determination result of the determination section so that the voltage value of the one memory cell is included in a range of the first voltage range on one side thereof relative to the reference value.

7. A non-volatile semiconductor memory device according to claim 1, wherein:
each of the plurality of memory cells is a memory cell transistor comprising a charge accumulation layer for accumulating electric charges; and
the memory cell transistor is capable of storing a plurality of data values depending on the amount of the electric charges accumulated in the charge accumulation layer.

8. A non-volatile semiconductor memory device according to claim 1, wherein the rewrite section shifts the voltage value of the one memory cell by applying a write pulse signal having a prescribed pulse width to the one memory cell.

9. A non-volatile semiconductor memory device according to claim 1, wherein the reference value is set to a middle value of the first voltage range.

10. A non-volatile semiconductor memory device according to claim 3, wherein the prescribed value is set to a difference value between the maximum value of the first voltage range and the reference value.

11. A non-volatile semiconductor memory device according to claim 3, wherein the prescribed value is set to a difference value between the minimum value of the first voltage range and the reference value.

12. A non-volatile semiconductor memory device according to claim 3, wherein:
the minimum value of the first voltage range is higher than a maximum value of the second voltage range; and
the prescribed value is set to a difference value between the minimum value of the first voltage range and a determination value indicating a determination voltage for distinguishing the first voltage range from the second voltage range.

13. A non-volatile semiconductor memory device according to claim 12, wherein the determination value is set to a middle value between the first voltage range and the second voltage range.

14. A non-volatile semiconductor memory device according to claim 3, wherein:
the maximum value of the first voltage range is lower than a minimum value of the second voltage range; and
the prescribed value is set to a difference value between the maximum value of the first voltage range and a determination value indicating a determination voltage for distinguishing the first voltage range from the second voltage range.

15. A non-volatile semiconductor memory device according to claim 14, wherein the determination value is set to a middle value between the first voltage range and the second voltage range.

16. A rewriting method for a non-volatile semiconductor memory device, comprising the steps of:
reading a voltage of a memory cell capable of storing a plurality of data values depending on the voltage thereof, wherein the plurality of data values include a first data value corresponding to a first voltage range and a second data value corresponding to a second voltage range, and the first data is written in the memory cell;
determining whether a value of the voltage of the memory cell is higher or lower than a reference value set between a maximum value and a minimum value of the first voltage range; and
rewriting the first data into the memory cell based on a determination result of the determining step so that a margin between the first voltage range and the second voltage range in the memory cell is enlarged.

17. A rewriting method according to claim 16, wherein the rewriting step comprises shifting the voltage value of the memory cell so that the voltage value of the memory cell is higher than the reference value if the determining step determines that the voltage value of the memory cell is smaller than the reference value set between the maximum value and the minimum value of the first voltage range.

18. A rewriting method according to claim 16, wherein the rewriting step comprises shifting the voltage value of the memory cell so that the voltage value of the memory cell is smaller than the reference value if the determining step determines that the voltage value of the memory cell is higher than the reference value set between the maximum value and the minimum value of the first voltage range.

19. A rewriting method according to claim 16, wherein:
the memory cell is a memory cell transistor comprising a charge accumulation layer for accumulating electric charges; and
the rewriting step comprises reinjecting electric charges into the charge accumulation layer.

20. A rewriting method according to claim 16, wherein the rewriting step comprises shifting the voltage value of the memory cell by applying a write signal having a prescribed pulse width to the memory cell.

* * * * *